(12) United States Patent
Goldbach et al.

(10) Patent No.: US 7,078,748 B2
(45) Date of Patent: Jul. 18, 2006

(54) MULTI-LAYER GATE STACK STRUCTURE COMPRISING A METAL LAYER FOR A FET DEVICE, AND METHOD FOR FABRICATING THE SAME

(75) Inventors: Matthias Goldbach, Dresden (DE); Frank Jakubowski, Dresden (DE); Ralf Koepe, Dresden (DE); Chao-Wen Lay, Dresden (DE); Kristin Schupke, Dresden (DE); Michael Schmidt, Dresden (DE); Cheng-Chih Huang, Dresden (DE)

(73) Assignees: Infineon Technologies AG, Munich (DE); Nanya Technology Corporation, Kueishan Taoyuan (TW)

( * ) Notice: Subject to any disclaimer, the term of this patent is extended or adjusted under 35 U.S.C. 154(b) by 19 days.

(21) Appl. No.: 10/865,763

(22) Filed: Jun. 14, 2004

(65) Prior Publication Data

US 2005/0275046 A1 Dec. 15, 2005

(51) Int. Cl.
*H01L 27/148* (2006.01)

(52) U.S. Cl. .................... 257/250; 257/412; 257/413; 438/588; 438/585; 438/587; 438/592

(58) Field of Classification Search ............... None
See application file for complete search history.

*Primary Examiner*—Fetsum Abraham
(74) *Attorney, Agent, or Firm*—Slater & Matsil, L.L.P.

(57) ABSTRACT

A multi-layer gate stack structure of a field-effect transistor device is fabricated by providing a gate electrode layer stack with a polysilicon layer, a transition metal interface layer, a nitride barrier layer and then a metal layer on a gate dielectric, wherein the transition metal is titanium, tantalum or cobalt. Patterning the gate electrode layer stack comprises a step of patterning the metal layer and the barrier layer with an etch stop on the surface of the interface layer. Exposed portions of the interface layer are removed and the remaining portions are pulled back from the sidewalls of the gate stack structure leaving divots extending along the sidewalls of the gate stack structure between the barrier layer and the polysilicon layer. A nitride liner encapsulating the metal layer, the barrier layer and the interface layer fills the divots left by the pulled-back interface layer. The nitride liner is opened before the polysilicon layer is patterned. As the requirement for an overetch into the polysilicon layer during the etch of the metal layer, the barrier layer and the interface layer is omitted, the height of the polysilicon layer can be reduced. The aspect ration of the gate stack structure is improved, the feasibility of pattern and fill processes enhanced and the range of an angle under which implants can be performed is extended.

15 Claims, 6 Drawing Sheets

MULTI-LAYER GATE STACK STRUCTURE COMPRISING A METAL LAYER FOR A FET DEVICE, AND METHOD FOR FABRICATING THE SAME

BACKGROUND

1. Field of the Invention

The present invention relates to a method for fabricating a multi-layer gate stack structure for a field-effect transistor (FET) device and to a multi-layer gate stack structure comprising a metal layer.

2. Background Information

Conventional integrated circuits comprise FET devices with an active area consisting of a source region, a drain region and a channel region between the source region and the drain region formed respectively in a semiconductor substrate beneath a substrate surface of the semiconductor substrate. Gate electrodes of the FET devices are formed above the channel region on a gate dielectric covering the substrate surface.

The gate electrodes of the FET devices are provided by first depositing a sequence of layers for a gate electrode layer stack on the gate dielectric and then patterning the gate electrode layer stack. In memory cell arrays the gate electrodes of a plurality of access transistors of memory cells form integrated constituent parts of gate tracks or wordlines for addressing the memory cells in the memory cell array. As the operating speed of the integrated circuits depends on the conductivity of the wordlines, materials with low resistivity are used for the gate electrode layer stack.

Efforts have been made to use a metal as one of the materials of the gate electrode layer stack. Usually tungsten is used for a metal layer in the gate electrode stack. As metal tends to diffuse into adjacent structures, thereby deteriorating, for example, the isolating properties of the adjacent structures, the metal layer is encapsulated at least towards the gate dielectric by a barrier layer suppressing the diffusion of metal. Adjacent to the gate dielectric, polysilicon is the preferred material, as the value of the work function best satisfies the requirements of the application.

In U.S. Pat. No. 6,198,144, a gate stack structure is described that comprises a polysilicon layer applied on a gate dielectric, an electrically conductive barrier layer applied on the polysilicon layer and a metal layer deposited on the barrier layer. The metal of the metal layer is tungsten and the barrier layer is made of tungsten nitride. On the metal layer, a silicon dioxide layer is deposited as an insulating cap oxide. A silicon nitride liner is provided on the sidewalls of the gate stack structure. When forming the tungsten nitride layer on the polysilicon layer, nitrogen is incorporated by the polysilicon of the polysilicon layer. Thereby a silicon nitride is formed deteriorating the electrical connection between the polysilicon layer and the barrier layer.

In German Patent Application DE 10 2004 004 864.9, an interface layer between the polysilicon layer and the barrier layer is described. The interface layer inhibits the incorporation of nitrogen in the underlying polysilicon layer. The interface layer comprises a refractory metal as, for example, titanium.

Another aspect of designing a gate stack structure is the height of the final gate stack structure. A reduction in gate stack height is desirable since process control deteriorates with increasing aspect ratio of the gate stack structures and of the trenches between them. Further, the source regions and the drain regions are formed by implants masked by the gate stack structures. To increase the performance of the access transistors of memory cells, angled implants adjusted by the upper edges of the gate stack structures are required. With increasing gate stack height, the range for the angle under which implants can be performed becomes narrower. Reducing the height of the metal layer would reduce the cross-sectional area thereof, leading to an unfavorable increase in the resistance of the wordline. The contribution of the barrier layer and the interface layer to the gate stack height is comparatively small.

The height of the polysilicon layer results from the process conditions of the etch steps performed during patterning the gate electrode layer stack. Patterning the metal layer, the barrier layer, the interface layer and the polysilicon layer in one step would require an etch that is effective on all materials of the stack and that does not damage the semiconductor substrate. Due to its thickness of about 2 nanometers for a typical gate stack structure width of less than 100 nanometers, the gate dielectric is not suitable to resist a longer overetch outside the gate stack structure.

Therefore the etch is commonly performed in at least two etch steps, wherein the first etch step is effective on the metal layer, the barrier layer and the interface layer and wherein the second etch step is effective on the polysilicon layer.

As a complete removal of the interface layer from the sidewalls of the gate stack structure must be secured, a first overetch into the underlying polysilicon layer is commonly provided.

The depth of the overetch into the polysilicon layer results from the condition to secure complete removal of the metal, barrier and interface layers respectively that are deposited consecutively as conformal layers on an uneven surface. In the vicinity of steps in the underlying surface a vertical thickness of the layers is increased, wherein the vertical thickness is effective for an anisotropic etch.

After the first etch step a dielectric passivation liner is usually formed that covers the sidewalls of the metal layer, the barrier layer and the interface layer being exposed by the first etch step. Opening the dielectric passivation liner before patterning the polysilicon layer requires a second overetch into the polysilicon layer.

The thickness of the polysilicon layer must be sufficient to permit the above-described overetches into the polysilicon layer.

Also the effect of divots between structures consisting of different materials in the underlying substrate surface must be taken into consideration. The material of the polysilicon layer fills the divots and the thickness of the polysilicon layer is locally increased, necessitating a further overetch of the polysilicon layer.

The various overetch conditions require a minimum process thickness of the polysilicon layer. The minimum process thickness is higher than a minimum functional thickness required by the electrical functionality of the polysilicon layer within the gate stack structure. A high gate stack structure is, however, not desirable for process technological reasons, in view of the quality of pattern and fill processes and in view of the range for an implant angle.

SUMMARY

A method is provided for fabricating a multi-layer gate stack structure for a FET device that requires less height of a gate electrode layer stack before patterning and that results in a lower height of the final gate stack structure. A multi- 'layer gate stack structure for a FET device also is provided, wherein the multi-layer gate stack structure results from the inventive method.

According to an aspect of the present invention, a method for fabricating a multi-layer gate stack structure comprising a metal layer is provided, wherein the method comprises the steps of depositing consecutively a polysilicon layer, a transition metal interface layer, an electrically conductive metal nitride barrier layer and a metal layer in this order on a gate dielectric, the gate dielectric covering a semiconductor substrate; patterning the metal layer and the barrier layer according to a planar structure selectively to the material of said interface layer, thereby partially exposing said interface layer; patterning the interface layer selectively to the polysilicon layer by removing exposed portions of the interface layer; and patterning the polysilicon layer selectively to the gate dielectric.

A multi-layer gate structure for a field-effect transistor device also is disclosed, the field-effect transistor device having an active region formed within a semiconductor substrate beneath a gate dielectric covering a substrate surface of the semiconductor substrate. The gate stack structure comprises a polysilicon layer formed on the gate dielectric, an interface layer having a transition metal silicide formed on the polysilicon layer, and a metal nitride barrier layer formed on the interface layer. A metal layer is formed on the barrier layer. A dielectric passivation liner covers upper sidewall portions of the gate stack structure above a liner edge, wherein the liner edge is located not more than 10 nanometers below an upper edge of the polysilicon layer. A dielectric sidewall liner covers a lower sidewall portion below the liner edge.

Further advantages, features and details of the invention emerge from the exemplary embodiments described below and also on the basis of the drawings.

BRIEF DESCRIPTION OF THE DRAWINGS

Further understanding of the nature and advantages of the present invention will become apparent by reference to the remaining portions of the specification and drawings, in which.

DETAILED DESCRIPTION

Figure 1A:
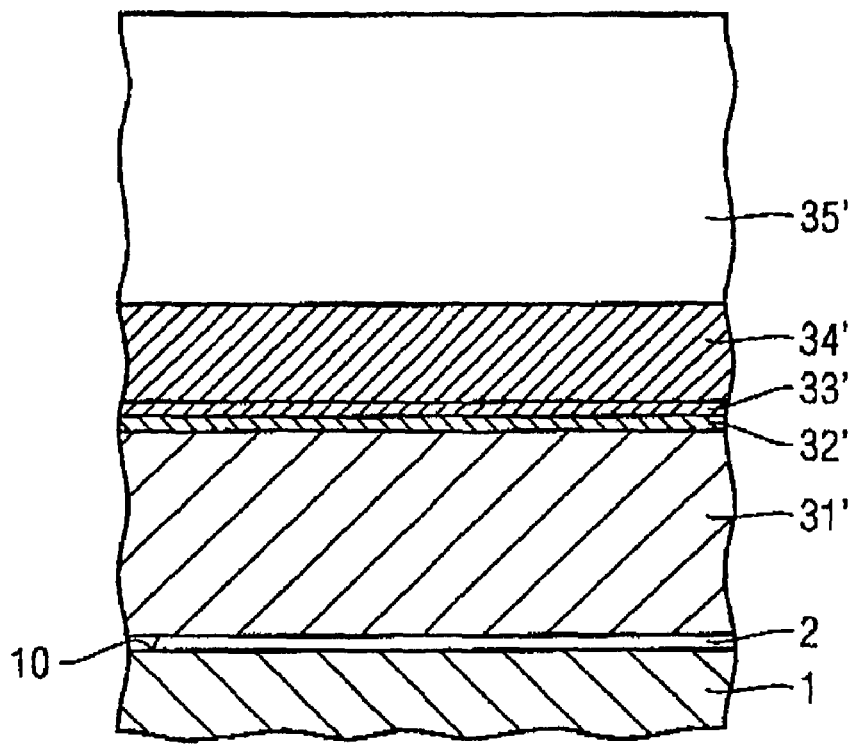
FIGS. 1A to 1D are cross-sectional views of multi-layer gate stack structures during process steps of a conventional method for fabricating conventional multi layer gate stacks comprising a metal layer.

In the figures, the same reference numbers are used to indicate the same or corresponding elements. Further, each layer is named by its reference number, amended by a prime (') after deposition. The corresponding patterned layers are marked by the reference numbers without prime. A list of reference symbols utilized consistently in the figures is provided below:

LIST OF REFERENCE SYMBOLS 1 semiconductor substrate
10 substrate surface
2 gate dielecric
3 gate stack structure
31' deposited polysilicon layer
31 patterned polysilicon layer
32' deposited interface layer
32 patterned interface layer
320 interface layer divot
321 pulled back interface layer
33' deposited barrier layer
33 patterned barrier layer
34' deposited metal layer
34 patterned metal layer
35' cap dielectric layer
35 cap dielectric
4 dielectric passivation liner
41 divot fill
5 dielectric sidewall liner
6 sacrificial oxide
7 shallow trench isolation
70 shallow trench isolation divot
8 conformal layer
OE1 overetch
OE2 overetch
SH step height
T thickness
DD divot depth Referring to FIGS. 1A to 1D, a process flow of a conventional method for forming a conventional multi-layer gate stack structure comprising a metal layer and used for a conventional FET device is described. A semiconductor substrate 1 is provided. An active area of a FET device comprising a source region, a drain region and a channel region between the source and the drain region is formed by implants performed subsequent to the patterning of gate stack structures 3 (shown in FIG. 1D).

On the semiconductor substrate 1 a gate dielectric 2 is formed covering a substrate surface 10 of the semiconductor substrate 1. On the gate dielectric 2 a polysilicon layer 31', an interface layer 32', a barrier layer 33', a metal layer 34' and a cap dielectric layer 35' are consecutively deposited in this order. The metal layer 34' is made of tungsten and defines the resistance of a connection to the gate electrode. The barrier layer 33' comprises a layer of tungsten nitride or titanium nitride and prevents metal from being diffused into the underlying layers. The interface layer 32' is made of titanium and prevents nitrogen from being incorporated in the polysilicon layer 31'. The resulting gate electrode layer stack is shown in FIG. 1A.

Figure 1B:
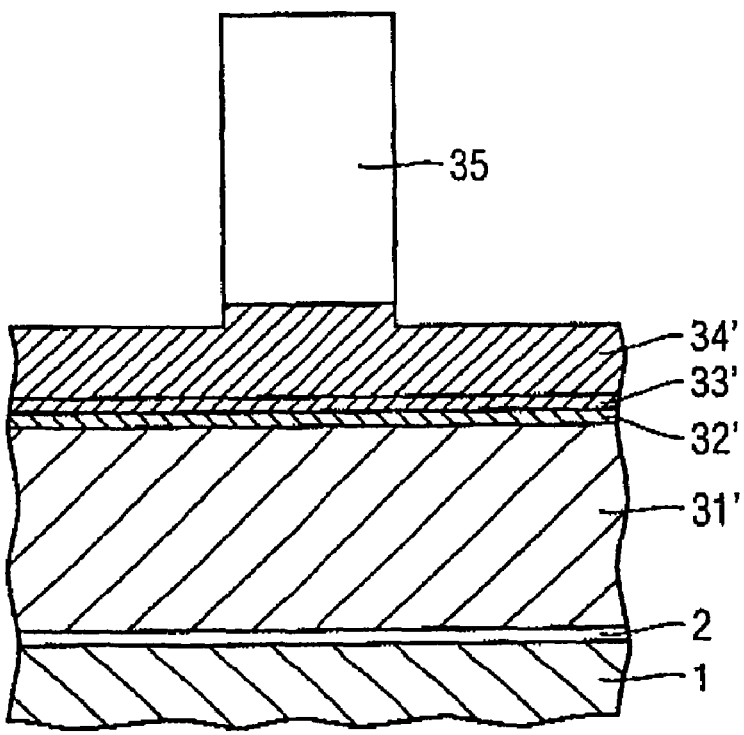
Figure 1C:
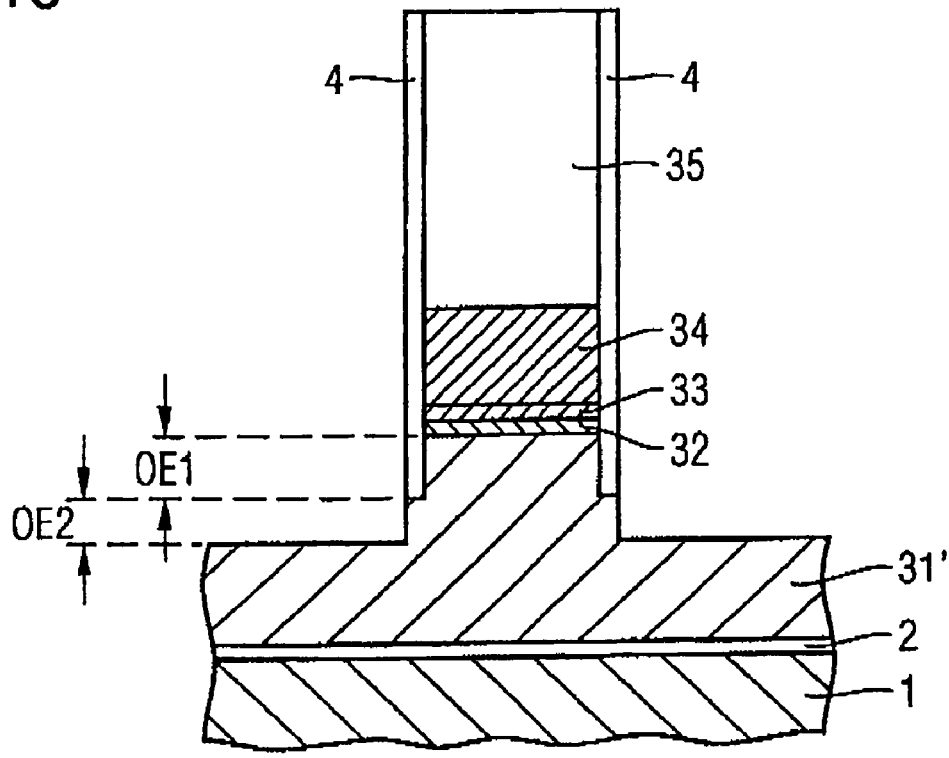

As shown in FIG. 1B the cap dielectric layer 35' is patterned by using photolithographic means in conventional manner. To ensure a complete removal of the cap dielectric layer 35' outside the gate stack structure 3 an overetch of the cap dielectric layer 35' into the metal layer 34' is performed, such that an upper portion of the metal layer 34' is patterned. A cap dielectric 35 of the gate stack structure 3 emerges from the cap dielectric layer 35'. An etch of the metal layer 34', the barrier layer 33' and the interface layer 32' is performed. As the complete removal of the interface layer 32' from the edges of the gate stack structure 3 must be ensured, as shown in FIG. 1C, a first overetch OE1 is performed, which removes 10 to 50 nm of the polysilicon layer 31' outside the gate stack structure 3. The cap layer 35, the metal layer 34, the barrier layer 33, the interface layer 32 and the upper, patterned portion of the polysilicon layer 31' are encapsulated by a silicon nitride liner forming a dielectric passivation liner 4. The dielectric passivation liner 4 is opened by removing horizontal portions covering the underlying polysilicon layer 31'. To ensure complete removal of the horizontal portions of the nitride liner 4 a second overetch OE2 into the polysilicon layer 31' is performed.

Figure 1D:
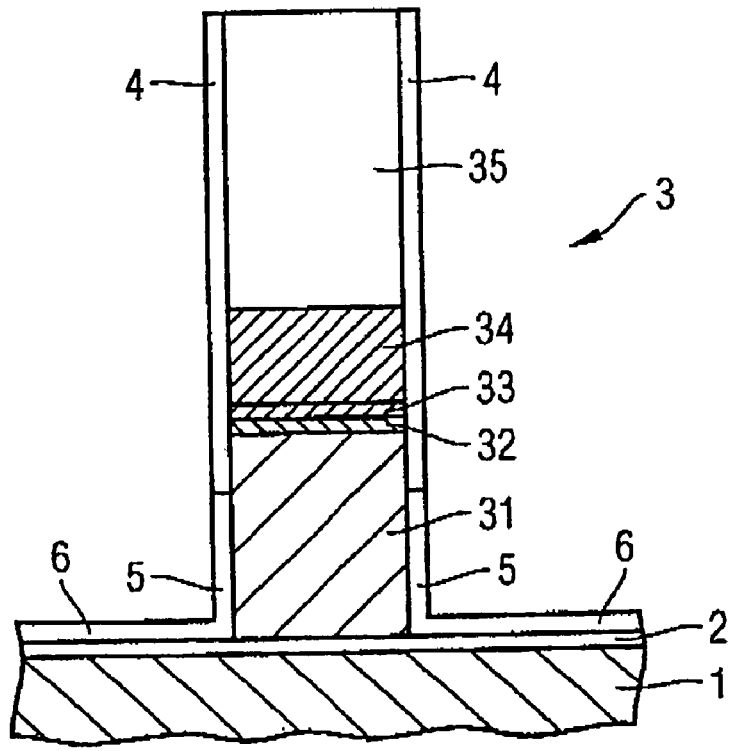

Referring to FIG. 1D, the polysilicon layer 31' is patterned by an etch selective to the gate dielectric 2. The exposed sidewall portions of the polysilicon layer 31 are oxidized, wherein a dielectric sidewall liner 5 of SiO2 is provided. As shown in FIG. 1, the height of the polysilicon layer 31 must meet the requirement of being sufficient for to allow the overetches OE1, OE2 necessary to ensure complete removal of the barrier layer 33, the interface layer 32 and the dielectric passivation liner 4 outside the gate stack structure 3.

Figure 2:
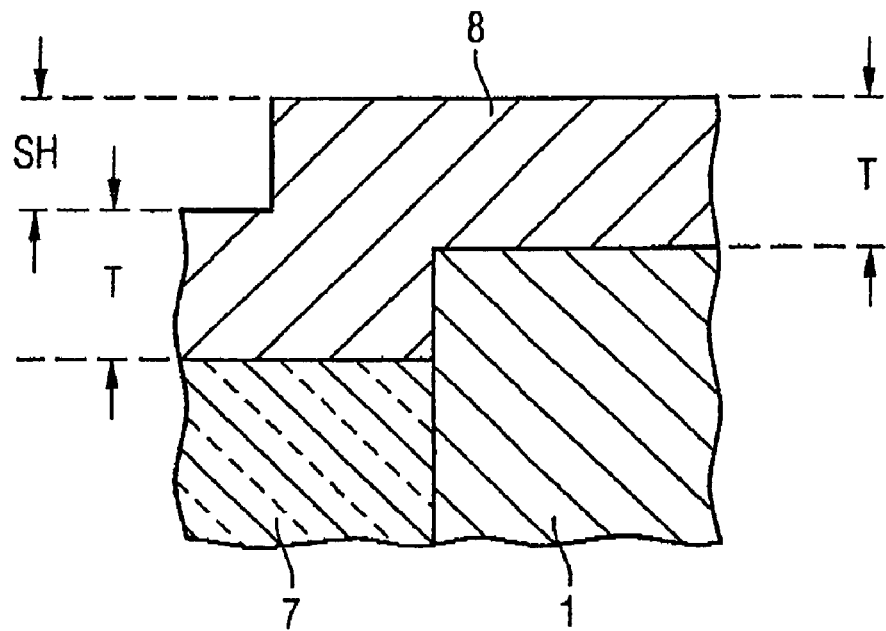
FIGS. 2 to 3 are cross-sectional views of layer structures discussing disadvantages of conventional methods for fabricating conventional multi-layer gate stacks with a metal layer.
Figure 3:
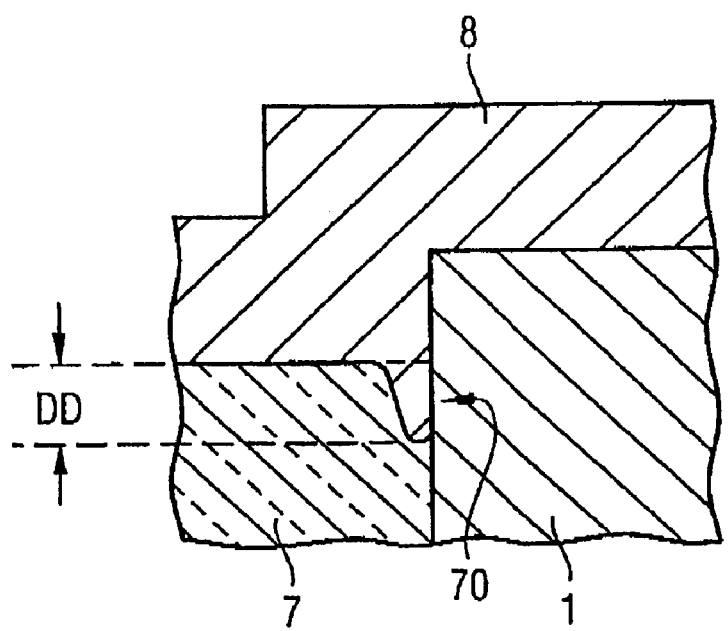

With FIGS. 2 to 3, additional problems of the above mentioned conventional method for forming a multi-layer gate stack structure are discussed. Commonly, before providing gate stack structures, shallow trench isolation structures 7 are formed in a semiconductor substrate 1. The shallow trench isolation structures 7 separate, for example, FET devices formed subsequently. The forming of shallow trench isolation structures 7 results in steps with a step height SH at the edges of the shallow trench isolation structures 7. When the layers of a gate electrode layer stack are deposited conformally and etched back isotropically the effect of the step height SH that increases locally the thickness T of a deposited layer 8 must be taken into consideration. An additional overetch for each deposited layer 8 must be performed to ensure its complete removal in the vicinity of the steps.

In FIG. 3, a further reason for an overetch is discussed. Shallow trench isolation structures 7 show divots 70 adjacent to the semiconductor substrate 1. The divots 70 are filled by the material of a conformally deposited layer 8. To avoid shorts between adjacent structures, an overetch of the conformal layer 8 must be performed, such that complete removal of the conformal layer 8 from the divots 70 is ensured. Substrate 1 must be prevented from being damaged during the whole etch of the deposited layer.

While the problem shown in FIG. 3 concerns especially the underlying polysilicon layer 31 the problem concerning step heights according to FIG. 2 applies to each layer of a gate electrode layer stack.

With reference to the FIGS. 4A to 4F, a detailed description of an embodiment according to the present invention is provided. FIGS. 4A to 4D are cross-sectional views of a gate stack structure 3 representing process steps of a method for fabricating a multi-layer gate stack structure comprising a metal layer.

Figure 4A:
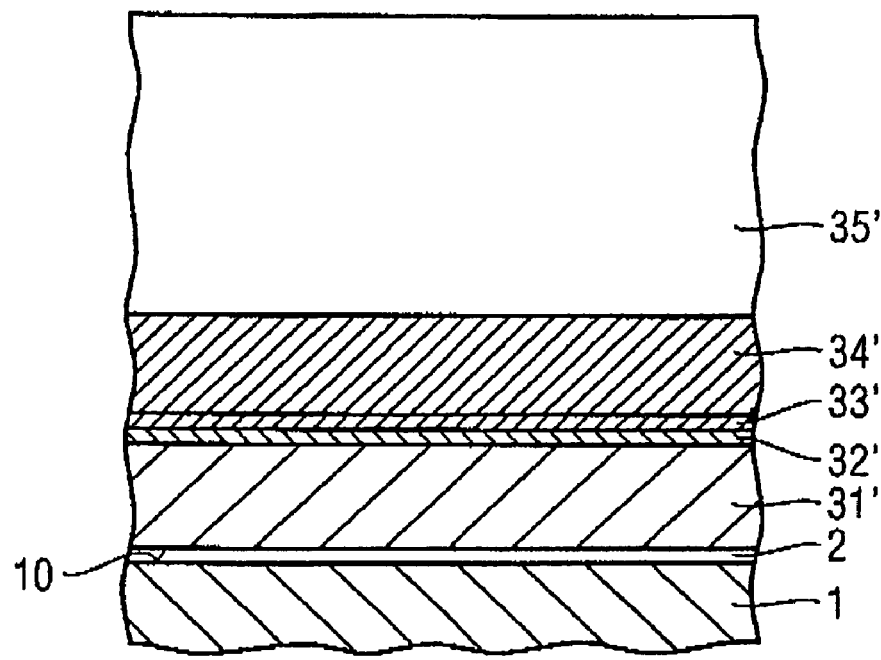
FIGS. 4A to 4F are cross-sectional views of a multi-layer gate stack structure according to an embodiment of the invention representing process steps of a method according to another embodiment of the present invention.
Figure 4B:
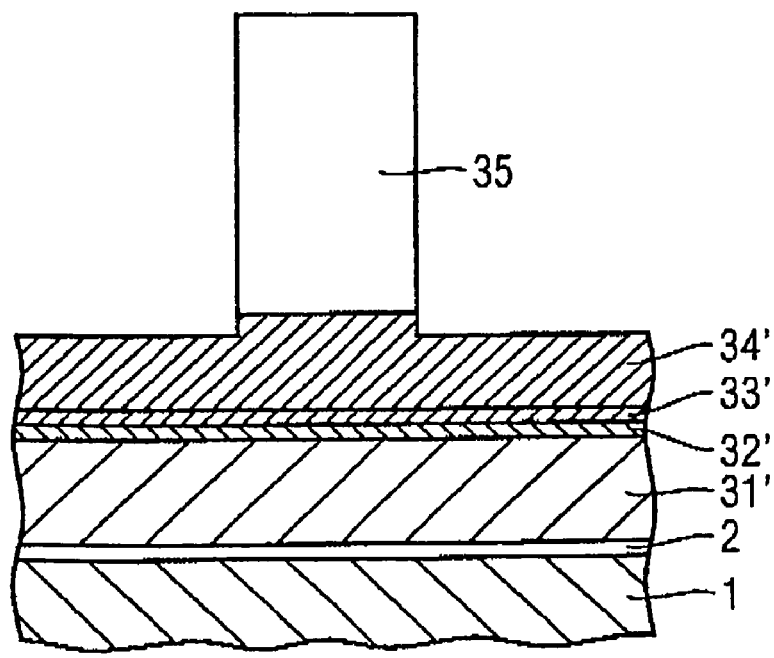
Figure 4C:
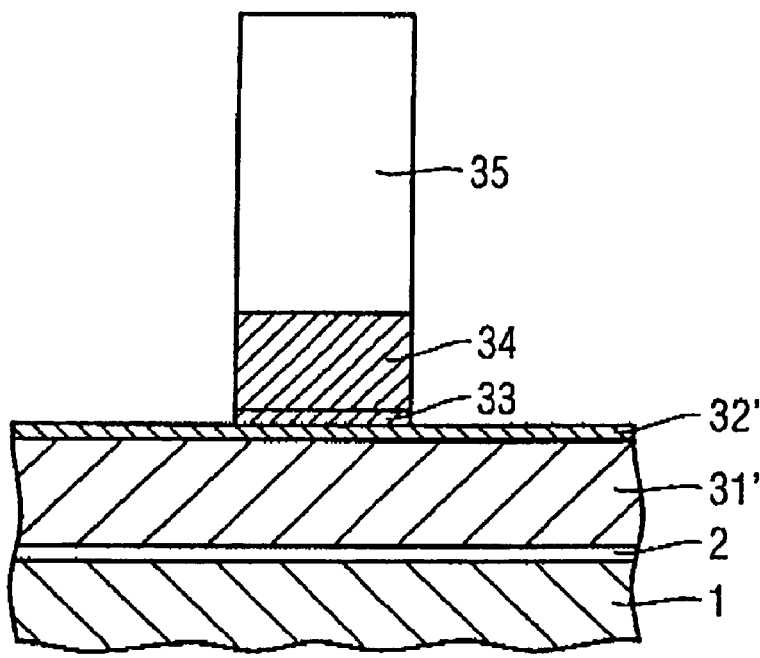

As shown in FIG. 4A, a gate dielectric 2 of silicon oxide is formed on a semiconductor substrate 1. A low resistance polysilicon layer 31' is formed on the gate dielectric 2. The gate dielectric 2 has a thickness of about 3 nanometers to 4 nanometers. The polysilicon layer 31' has a thickness of about 65 nm. On the polysilicon layer 31', an interface layer 32' of titanium with a thickness of 3 nm is provided. Optionally, titanium silicide is formed from at least a portion of the titanium. On the interface layer 32', a tungsten nitride layer 33' is provided with a thickness of 5 nm. On the tungsten nitride layer 33', which forms a barrier layer 33', a metal layer 34' of tungsten with a thickness of 30 nm is formed. On the metal layer 34', a cap dielectric layer 35' of silicon nitride is formed with a thickness of 100 nm.

By using conventional lithographic patterning methods, the cap dielectric layer 35' is patterned. An overetch of the dielectric layer 35' into the metal layer 34' is performed, as shown with reference to FIG. 4B.

A tungsten/tungsten nitride etch with high selectivity to the interface layer is performed by using a fluor based chemistry. The etch stops on the interface layer 32'.

Optionally an etch stop signal can be generated when the interface layer 32' is exposed.

A pullback of the tungsten layer 34' and the tungsten nitride layer 34' (not shown) can be performed.

Figure 4D:
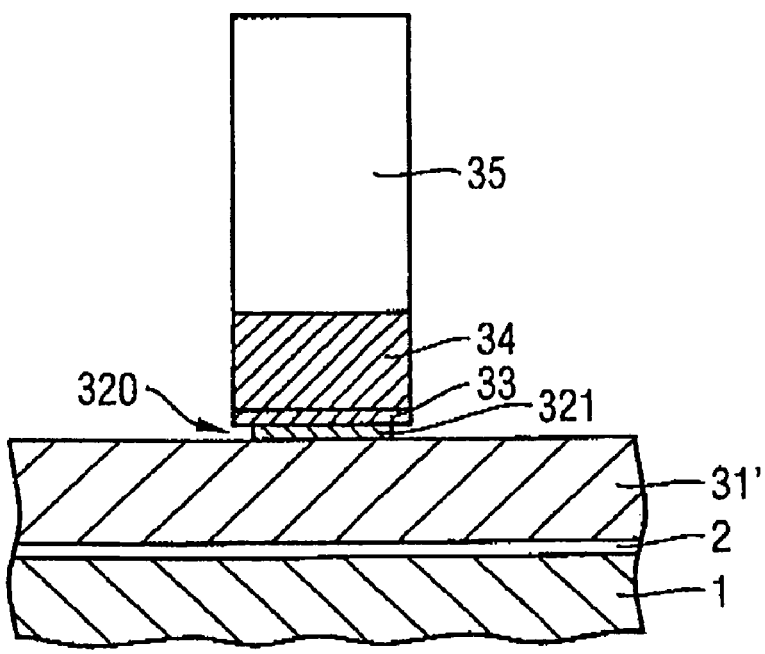
Figure 4E:
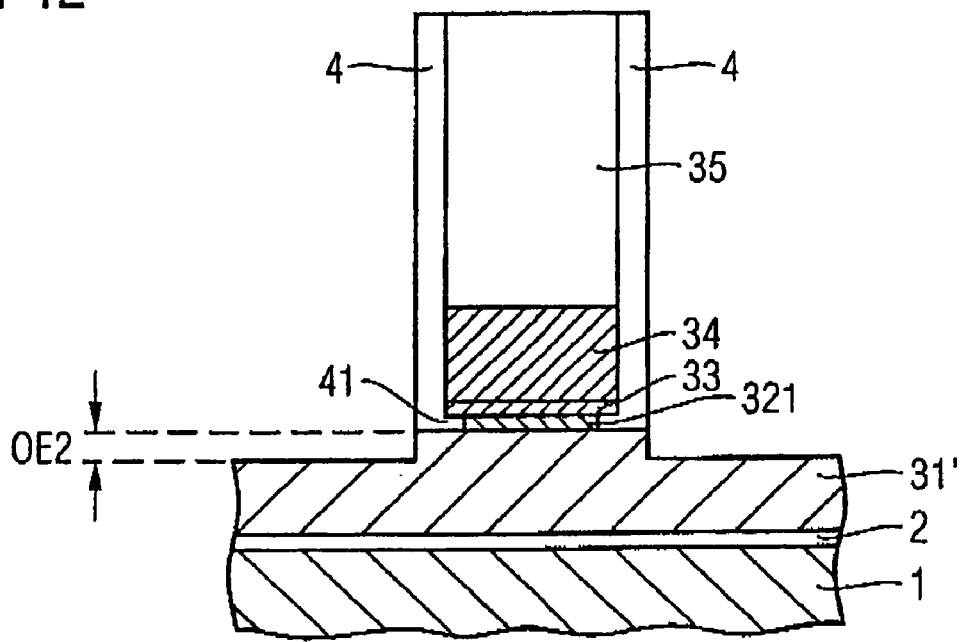

A wet etch of the interface layer 32' is performed by using hot DHF. In FIG. 4D, the gate stack structure after wet etching the titanium layer 32' is shown. The pulled back titanium layer 321 has left interface layer divots 320 between the barrier layer 33 and the underlying polysilicon layer 31'. The divots extend adjacent the sidewalls to a depth of at least about 1 nanometer and at most about 10 nanometers into the gate stack structure 3.

In the following a silicon nitride liner is deposited as a dielectric passivation liner 4 covering an upper portion of the sidewall of the gate stack structure 3 above the upper edge of the polysilicon layer 31'. Divot fills 41 of silicon nitride fill the interface layer divots 320. The nitride liner 4 is opened outside the gate stack structure 3. The nitride liner 4 is removed from the horizontal surface of the polysilicon layer 31' outside the gate stack structure 3, wherein etching of the nitride liner 4 is performed with an overetch OE2 into the polysilicon layer 31'.

Figure 4F:
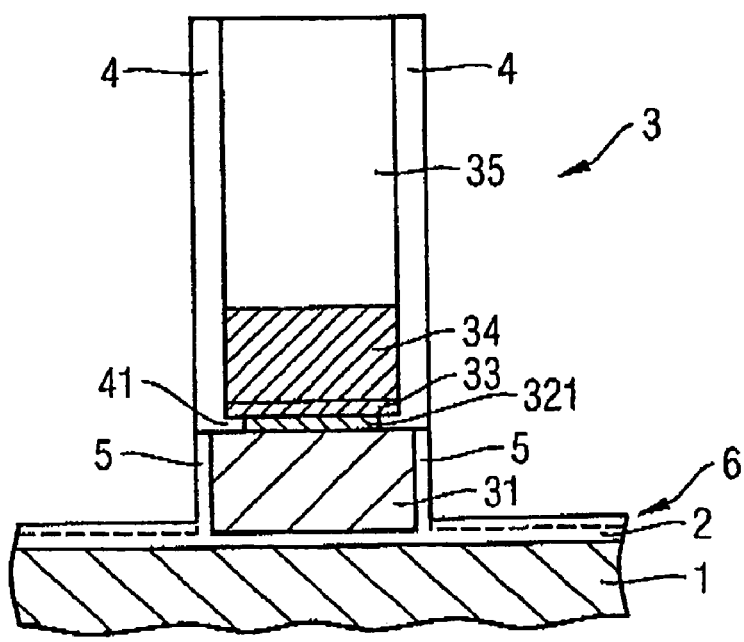

Referring now to FIG. 4F, an embodiment of the inventive multi-layer gate stack structure 3 resulting from the inventive method is shown. After patterning the polysilicon layer 31', an oxidation of the exposed vertical sidewall portions is performed. The polysilicon layer 31 is encapsulated by a sidewall oxide liner 5.

The oxidation leads to an increase of the thickness of the gate oxide 2 outside the gate stack structure 3 forming a sacrificial oxide 6.

The height of the polysilicon layer 31 is reduced by the amount of an overetch OE 1 into the polysilicon layer 31, wherein the overetch OE 1 is required in conventional methods, during which the metal layer 34, the barrier layer 33 and the interface layer 32 are etched blind ended and the effect of increased layer thickness in the vicinity of steps in the substrate surface must be taken into consideration for each deposited layer.

Therefore, according to an aspect of the present invention, a method for fabricating a multi-layer gate stack structure comprising a metal layer is provided, wherein the method comprises the steps of: depositing consecutively a polysilicon layer, a transition metal interface layer, an electrically conductive metal nitride barrier layer and a metal layer in this order on a gate dielectric. The gate dielectric covers a semiconductor substrate. The metal layer is patterned according to a planar structure selectively to said material of said interface layer, thereby partially exposing said interface layer. The interface layer is patterned selectively to said polysilicon layer by removing exposed portions of said interface layer. The polysilicon layer is patterned selectively to said the dielectric.

Patterning is performed by an essentially anisotropic etch of a process layer masked and partially covered by a mask layer, wherein exposed portions of the process layer are removed and the pattern of the mask layer is engraved into the process layer. By patterning a process layer selectively to an underlying layer, the material of the process layer is removed with an essentially higher rate than the material of the underlying layer.

As the interface layer is used as an etch stop layer during removal of the metal layer and the barrier layer, as further the interface layer can be etched with high selectivity against the polysilicon layer and as finally the interface layer is comparatively thin, merely a comparatively small overetch into the polysilicon layer is required to ensure complete removal of the metal, the barrier and the interface layer. The height of the polysilicon layer can be reduced by the amount of the omitted overetch. The overall height of the gate stack structure is lowered. The aspect ratio of trenches between the gate stack structures is improved and the range for an implant angle for angled implants is expanded.

Preferably, the metal layer and the barrier layer are pulled back by an isotropic etch after or during being patterned. In common etch steps the cross-sectional area of the etched metal layer is tapered. If a sidewall liner is deposited in the following on sidewalls of the gate stack structure in a conformal manner, the thickness of the sidewall liner is reduced at the edges. When the sidewall liner is opened later, the metal layer might be exposed at the edges and shorts to the adjacent structure, for example a bit line contact structure contacting a source or a drain region of the FET device, might occur. These shorts are avoided by pulling back the metal layer and the barrier layer after patterning them.

According to a preferred embodiment of the invention, a dielectric sidewall passivation liner is deposited after patterning of the interface layer. The dielectric sidewall passivation liner is opened, wherein horizontal portions of the dielectric sidewall passivation liner outside the gate stack structure are removed from the polysilicon layer. The dielectric sidewall passivation liner then covers the sidewalls of the gate stack structure formed by the metal layer, the barrier layer and the interface layer protecting them during the following process steps.

In a preferred embodiment of the inventive method the interface layer is patterned by an isotropic etch, wherein the edges of the remaining portion of the interface layer within the gate stack structure are pulled back at least 1 nanometer and at most 10 nanometer from the sidewalls of the gate stack structure. Thereby interface layer divots are formed between the barrier layer and the polysilicon layer extending along the sidewalls of the gate stack structure. As the interface layer is pulled back, the edges of the interface layer are reliably prevented from being oxidized in the following.

According to a preferred embodiment of the invention a dielectric sidewall passivation liner is formed on exposed upper sidewalls of the gate stack after the interface layer is pulled back. The dielectric sidewall passivation liner then covers the sidewalls of the gate stack structure formed by the metal layer, the barrier layer and fills the divots emerging from the pullback of the interface layer. The edges of the interface layer are therefore prevented from being oxidized when a dielectric sidewall liner along the sidewalls of the polysilicon layer is formed in following process steps.

Preferably the dielectric sidewall liner is formed on the sidewalls of the polysilicon layer after patterning of the polysilicon layer.

In accordance with a further preferred embodiment of the invention the barrier layer is provided with a nitride of the metal of the metal layer. Deposition, patterning and pullback of the metal layer and the barrier layer can then be performed advantageously in one common process step respectively. Further the consecutive deposition of the barrier layer and the metal layer is simplified.

The patterning of the barrier layer and the metal layer is advantageously performed by a wet etch step. By a wet etch high selectivity of the etch process between the material of the metal layer and the barrier layer on the one hand and the interface layer on the other hand can be achieved.

In a preferred embodiment of the inventive method the interface layer is pulled back by a wet etch step using hot dilute hydrofluoric acid (DHF) or a sulfuric acid ozone mixture (SOM). With hot DHF a selectivity of the process between the interface layer and the polysilicon layer of two can be achieved and the overetch into the polysilicon is further reduced.

According to a further preferred embodiment of the invention a cap dielectric layer is deposited on the metal layer and patterned before patterning the metal layer. The cap dielectric layer can be partly used as part of a hard mask during the following patterning steps while a remanent portion is used as a cap dielectric of the gate stack structure.

According to the inventive method a multi-layer gate stack structure for a FET device with an active region in a semiconductor substrate covered by a gate dielectric is reliably fabricated, wherein said multi-layer gate stack structure comprises: a polysilicon layer formed on said gate dielectric; an interface layer formed on said polysilicon layer, wherein said interface layer comprises of transition metal silicide; a barrier layer formed on said interface layer, wherein said barrier layer comprises at least one metal nitride layer; a metal layer formed on said barrier layer; a dielectric passivation liner covering an upper sidewall portion of said gate stack structure above a liner edge, wherein said liner edge is located not more than 10 nanometers beneath an upper edge of said polysilicon layer; and a dielectric sidewall liner covering a lower sidewall portion beneath said liner edge.

According to a preferred embodiment of the inventive multi-layer gate stack structure a dielectric cap is formed on said metal layer.

In a preferred embodiment of the multi-layer gate structure the interface layer is drawn back from the sidewalls of the gate stack structure and the passivation liner is protruding the gate stack structure in lieu thereof filling thereby the divots left by the pulled back interface layer between the barrier layer and the polysilicon layer and extending along the sidewalls of the gate stack structure at least 1 nanometer and at most 10 nanometers into the gate stack structure.

Advantageously an oxidation of the material of the interface layer is reliably avoided as the interface layer is encapsulated even when the dielectric sidewall liner on the polysilicon portion of the gate stack structure is formed by oxidation and oxygen diffuses along the sidewalls into the polysilicon layer.

According to a preferred embodiment of the multi-layer gate stack structure the barrier layer comprises a first layer comprising a nitride of the material of the interface layer and a second layer comprising a nitride of the metal of the metal layer. The first nitride liner is provided for absorbing nitrogen, while the second nitride liner is provided for preventing diffusion of metal out of the metal layer.

In a preferred embodiment the transition metal comprised in the interface layer is a refractory metal or cobalt, wherein the refractory metal is preferably titanium or tantalum.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. Method for fabricating a multi-layer gate stack structure for a field-effect transistor device, comprising:
consecutively depositing a polysilicon layer, a transition metal interface layer, a metal nitride barrier layer and a metal layer on a gate dielectric;
patterning the metal layer and the barrier layer selectively to the interface layer, thereby partially exposing the interface layer;
patterning the interface layer selectively to the polysilicon layer by removing exposed portions of said interface layer; and
patterning the polysilicon layer selectively to the gate dielectric.

2. The method of claim 1, further comprising
etching isotropically the metal layer and said barrier layer after the step of patterning said metal layer.

3. The method of claim 1, further comprising:
forming a dielectric passivation liner on exposed upper sidewalls of said gate stack structure after the step of patterning the interface layer.

4. The method of claim 1, further comprising:
forming interface layer divots between the barrier layer and the polysilicon layer along the sidewalls of said gate stack structure and extending at least 1 nanometer and at most 10 nanometers into the gate stack structure during or after the step of patterning said interface layer.

5. The method of claim 4, further comprising:
forming a dielectric passivation liner on exposed upper sidewalls of said gate stack structure before patterning the polysilicon layer,
wherein the interface layer divots are filled with divot fills formed by the dielectric passivation liner.

6. The method as in claim 4, wherein the step of patterning said interface layer is performed by a wet etch step using dilute hydrofluoric acid.

7. The method of claim 1, further comprising:
forming a dielectric sidewall liner on exposed sidewalls of the polysilicon layer after patterning the polysilicon layer.

8. The method of claim 1, further comprising:
providing the nitride of the barrier layer as a nitride of the metal of the metal layer.

9. The method of claim 8, wherein the barrier layer and the metal layer are patterned in one wet etch step.

10. The method of claim 1, wherein the steps of providing a cap dielectric layer and patterning the cap dielectric layer are performed before the step of patterning the metal layer and the barrier layer.

11. A multi-layer gate structure for a field-effect transistor device, the field-effect transistor device having an active region formed within a semiconductor substrate beneath a gate dielectric covering a substrate surface of the semiconductor substrate, the gate stack structure comprising:
a polysilicon layer formed on the gate dielectric;
an interface layer having a transition metal silicide formed on the polysilicon layer;
a metal nitride barrier layer formed on the interface layer;
a metal layer formed on the barrier layer;
a dielectric passivation liner covering upper sidewall portions of the gate stack structure above a liner edge, wherein the liner edge is located not more than 10 nanometers below an upper edge of the polysilicon layer; and
a dielectric sidewall liner covering a lower sidewall portion below the liner edge.

12. The multi-layer gate structure of claim 11, further comprising a cap dielectric formed on the metal layer.

13. The multi-layer gate structure of claim 11, wherein the interface layer is drawn back from sidewalls of said gate stack structure, and the dielectric passivation liner extends to at least 1 nanometer and at most 10 nanometers into the gate stack structure in lieu thereof forming divot fills, the divot fills extending between the barrier layer and the polysilicon layer along the sidewalls of said gate stack structure.

14. The multi-layer gate structure of claim 11, wherein the barrier layer comprises a first layer adjacent to the interface layer, the first layer comprising a nitride of the transition metal of the interface layer and a second layer adjacent to the metal layer, the second layer comprising a nitride of said metal of the metal layer.

15. The multi-layer gate stack structure of claim 11, wherein the transition metal is a refractory metal or cobalt.

* * * * *